United States Patent [19]

Igarashi

[11] 4,414,559
[45] Nov. 8, 1983

[54] SEMICONDUCTOR THYRISTOR DEVICE WITH LATERALLY DISPLACED AUXILIARY AND MAIN CATHODE REGIONS

[75] Inventor: Yukio Igarashi, Yokohama, Japan

[73] Assignee: Tokyo Shibaura Denki Kabushiki Kaisha, Kawasaki, Japan

[21] Appl. No.: 255,167

[22] Filed: Apr. 17, 1981

Related U.S. Application Data

[63] Continuation of Ser. No. 25,652, Mar. 30, 1979, abandoned.

[30] Foreign Application Priority Data

Mar. 31, 1978 [JP] Japan ................................ 53-37758

[51] Int. Cl.³ ............................................. H01L 29/74
[52] U.S. Cl. ........................................ 357/38; 357/20; 357/86; 357/68
[58] Field of Search ................. 357/20, 38, 68, 86

[56] References Cited

U.S. PATENT DOCUMENTS

| | | | |
|---|---|---|---|
| 3,440,501 | 4/1969 | Piccone et al. | 357/38 |
| 3,573,572 | 4/1971 | Cooper et al. | 357/38 |
| 3,943,548 | 3/1976 | Terasawa | 357/38 |
| 3,990,090 | 11/1976 | Terasawa et al. | 357/38 |
| 4,016,591 | 4/1977 | Terasawa | 357/38 |
| 4,028,721 | 6/1977 | Yatsuo et al. | 357/38 |
| 4,063,270 | 12/1977 | Kimura et al. | 357/38 |
| 4,114,178 | 9/1978 | Terasawa et al. | 357/38 |

FOREIGN PATENT DOCUMENTS 1209211 1/1966 Fed. Rep. of Germany ........ 357/38

OTHER PUBLICATIONS

G. E. SCR Manual, 5th Edition, ©1972, p. 7.

*Primary Examiner*—Joseph E. Clawson, Jr.
*Attorney, Agent, or Firm*—Oblon, Fisher, Spivak, McClelland & Maier

[57] ABSTRACT

A semiconductor device having a semiconductor body including an anode layer, a first and second base layer, a cathode layer formed on the second base layer and an auxiliary region formed on the second base layer apart from the cathode layer. The semiconductor body has a peripheral zone, a gate peripheral zone, a corridor and an enlarged corridor, the corridor and the enlarged corridor being between a cathode electrode and an auxiliary electrode in contact with the auxiliary region. The width of the gate peripheral zone is larger than that of the peripheral zone and the width of the enlarged corridor is larger than that of the corridor.

16 Claims, 5 Drawing Figures

SEMICONDUCTOR THYRISTOR DEVICE WITH LATERALLY DISPLACED AUXILIARY AND MAIN CATHODE REGIONS

This is a continuation, of application Ser. No. 025,652 filed Mar. 30, 1979 abandoned.

BACKGROUND OF THE INVENTION

1. Field of the Invention

This invention relates to a semiconductor device having a gate electrode.

2. Description of the Prior Art

A prior art semiconductor device comprises a semiconductor body having a P type anode layer, an N type base layer superposed thereon, a P type base layer superposed thereon, an N type cathode layer superposed thereon and an N type auxiliary region formed in the P base layer and being in close vicinity to the cathode layer. An auxiliary electrode, namely a pilot ring gate electrode formed on the auxiliary region surrounds a cathode electrode in contact with the cathode layer. The width of a corridor between the cathode electrode and the auxiliary electrode is constant on the whole circle.

But, because of forming a gate electrode on a peripheral zone which is located between the auxiliary electrode and the edge of the semiconductor body, an enlarged peripheral zone, namely a gate peripheral zone is formed. It is generally desired to obtain the largest current in the main thyristor, if possible. Therefore, when the disc wafer is utilized for the device, the cathode layer is substantially formed in a circular form. But, because of forming the gate electrode on the gate peripheral zone, the cathode layer is so formed as to have a cut off portion, and the form of the cathode electrode is similar to that of the cathode layer. The form of the auxiliary electrode is similar to that of the edge of the cathode electrode also, for the width of the corridor between the auxiliary electrode and the cathode electrode is constant.

On supplying a signal to the gate electrode, an initial turn-on current of the semiconductor device occurs on the auxiliary region or the neighborhood thereof. As the gate peripheral zone is larger than the other peripheral zone, a larger current flows into the auxiliary region or the neighborhood thereof. The current produced on the initial turn-on flows through the auxiliary region and the auxiliary electrode formed thereon and the corridor of the P base layer into the cathode layer. As a result, a main thyristor comprising the anode layer, the N base layer, the P base layer and the cathode layer is turned on. But, because of a lack of uniform width of the corridor and because the alumunum layer of the auxiliary electrode has a sheet resistance, the current does not flow uniformly from the auxiliary electrode to the cathode layer through the P base layer. The current produced in the enlarged peripheral zone is larger than the other current. The larger current flows through the auxiliary electrode adjacent to the enlarged peripheral zone into the cathode layer adjacent thereto. Therefore a current concentration is apt to occur on the zone adjacent to the enlarged peripheral zone. The semiconductor device would be destroyed by the current concentration.

In the case that a larger disc silicon wafer is utilized for maintaining a larger current therein, the current concentration would further easily occur in a limited zone of the wafer, that is to say the gate peripheral zone thereof. As the excessive current flows in the limited zone, the limited zone including an PN junction does not function as a PN junction, but as a resistance. As the current concentration is apt to occur in the semiconductor device when a surge current flows therein, the semiconductor device would be permanently destroyed.

SUMMARY OF THE INVENTION

An object of this invention is to provide a semiconductor device which is satisfactory as regards current characteristics.

Another object of this invention is to provide a semiconductor device which is uniformly able to maintain a current.

A further object of this invention is to provide a semiconductor device which is able to withstand a current surge.

The objects of the present invention are achieved by a semiconductor device comprising a semiconductor body having two opposing principal surfaces including an anode layer of one conductivity type being exposed to one of said principal surfaces, a first base layer of an opposite conductivity type, being superposed on said anode layer, a second base layer of said one conductivity type being superposed on said first base layer and having a portion exposed to the other principal surface, a cathode layer of said opposite conductivity type being formed in said second base layer, and an auxiliary region of said opposite conductivity type formed in said second base being separated from said cathode layer, said semiconductor body having a peripheral zone, a gate peripheral zone of which the width is larger than that of said peripheral zone, a corridor, and an enlarged corridor of which the width is larger than that of said corridor being in the vicinity of said gate peripheral zone; an anode electrode in contact with the surface of said anode layer; a cathode electrode in contact with the surface of said cathode layer; a gate electrode in contact with the surface of said second base layer, said gate electrode being formed at said gate peripheral zone; and auxiliary electrode in contact with said auxiliary region and said second base layer, said auxiliary electrode surrounding apart from said cathode electrode and being between said gate peripheral zone and said enlarged corridor and between said peripheral zone and said corridor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
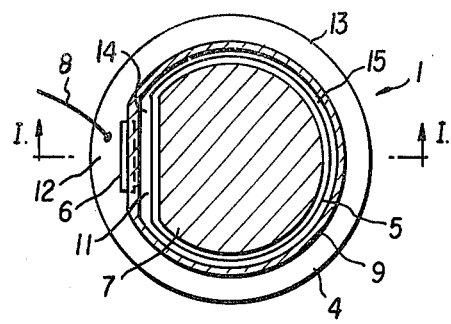
FIG. 1 is a plan view of a semiconductor device according to one embodiment of the present invention.
Figure 2:
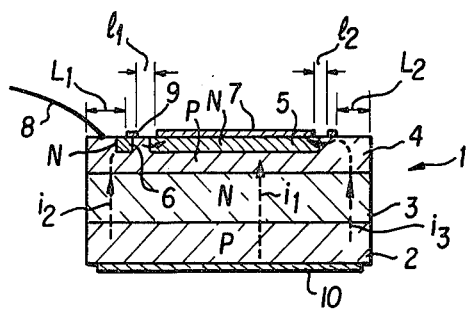
FIG. 2 is a sectional view of the semiconductor device taken on the line I—I in FIG. 1.

Referring now to the drawings, when like reference numerals designate identical or corresponding parts throughout the several views, and more particularly to FIGS. 1 and 2 thereof, the semiconductor device of the present invention is described hereinunder.

In FIGS. 1 and 2, there is illustrated a semiconductor device 1 comprising a semiconductor body including therein four contiguous layers. The four layers include an anode layer 2, a first base layer 3, a second base layer 4, a cathode layer 5, and an auxiliary region 6 formed in the second base layer 4. Adjacent ones of the four contiguous layers have a conductivity type different from each other. The four contiguous layers including a P type anode layer 2, an N type first base layer 3, a P type second base layer 4 and an N type cathode layer 5 comprise a main thyristor. The auxiliary region 6 functions as a cathode of an auxiliary thyristor. A cathode electrode 7 is in ohmic contact with the cathode layer 5 having shorted holes (not shown). This is a shorted emitter structure. Therefore, the cathode electrode 7 is in ohmic contact with the second base layer 4 through shorted holes too. The anode electrode 10 is so formed as to be in ohmic contact with the anode layer 2.

A gate electrode 8 in ohmic contact with the second base layer 4 is formed on an enlarged peripheral zone 12 adjacent to the auxiliary region 6. The enlarged peripheral zone is referred to as a gate peripheral zone in the following. The gate peripheral zone 12 is wider than the other peripheral zone 13. The peripheral zones 12, 13 are separated by the auxiliary electrode 9 from corridors 14, 15 surrounding the cathode electrode 7. The auxiliary electrode 9 is in contact with the auxiliary region 6 and the second base layer 4 and is spaced from and surrounds the cathode electrode 7. The enlarged corridor 14 in the vicinity of the gate peripheral zone 12 is wider than the other corridor 15.

Here, $L_1$ is the width of the gate peripheral zone 12; $L_2$, the width of the other peripheral zone 13; $l_1$, the width of the enlarged corridor 14; $l_2$, the width of the other corridor 15. In the case of the semiconductor device of which $L_1$ is wider than $L_2$, the width $l_1$ of the enlarged corridor 14 is formed larger than the width $l_2$ of the other corridor 15. In FIG. 1, the width of the enlarged corridor 14 is formed substantially uniform and that of the other corridor is formed so too. As soon as a signal is impressed on the gate electrode 8, the auxiliary thyristor is initially turned on. Then an initial current $i_2$ flows into the cathode layer 5 of the main thyristor through an auxiliary region 6, the auxiliary electrode 9 and the corridor 14, 15 of the second base layer 4 in FIG. 2. The other initial current $i_3$ similarly flows into the cathode layer 5 through the second base layer 4. Then the main thyristor comprising the anode layer 2, the first base layer 3, the second base layer 4 and the cathode layer 5 is turned on and the current $i_1$ flows into the main thyristor.

The prior art semiconductor device is formed in a disc wafer having a diameter of 75 mm. The width $L_1$ of the semiconductor device is 8 mm; the width $L_2$ thereof, 5 mm; the width $l_1 = l_2 = 1$ mm. In the prior art semiconductor device, a surging current capacitance is between about 35 kA and about 42 kA on impressing a half sine wave of 50 Hz. On the contrary, the surging current capacitance is between about 45 kA and 50 kA in the semiconductor device of this invention. The surging current capacitance in the semiconductor device of this invention is improved to a large degree. Except for the fact that the width $l_1$ is 1.5 mm and the width $l_2$ is 1 mm, the semiconductor device of this invention is equal to the prior art semiconductor device described in the above as regards the diameter and the width value thereof.

It is desired that the width ration $l_1/l_2$ be so designed that the power consumed on the zone between the auxiliary electrode and the cathode electrode is uniform on the whole. The optimum width ration $l_1/l_2$ is in proportion to the width ration $L_1/L_2$. In the semiconductor device described in the above, the optimum width ratio $l_1/l_2$ is about 1.3.

Figure 3:
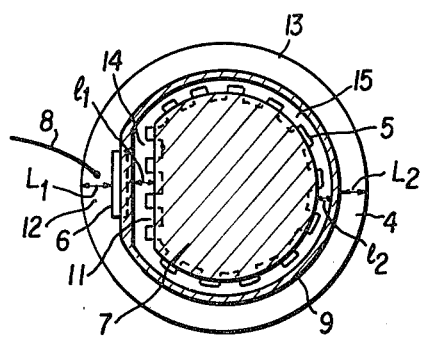
FIG. 3 is a plan view of a semiconductor device according to another embodiment of the present invention.

For making a larger value of dv/dt, the cathode layer 5 may be formed in the shape of teeth of a comb as shown in FIG. 3. The cathode electrode 7 having a cut off portion is formed on the cathode layer 5. The shorted emitter configuration is formed near the periphery of the cathode layer 5 in the FIG. 3. Except for the above, the semiconductor devices in FIGS. 1 and 3 are the same. The initial current produced by a gate signal uniformly flows through the auxiliary region 6, the auxiliary electrode 9 and the corridor 14, 15 into the cathode layer 5 in the teeth of the comb. The same effect is obtained in the semiconductor device wherein the cathode electrode is in the shape of teeth of a comb and the cathode layer of circular arc shape is attached thereto.

Figure 4:
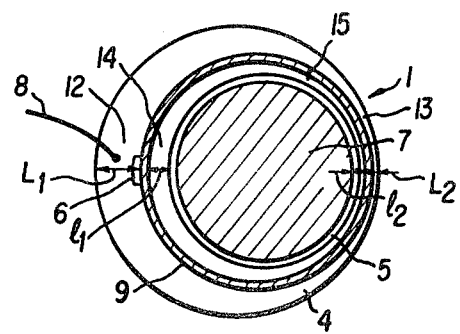
FIG. 4 is a plan view of a semiconductor device according to a further embodiment of the present invention.

The semiconductor device of a further embodiment of this invention is shown in FIG. 4. The semiconductor device 1 of a disc shape comprises a P type anode layer, an N type first base layer superposed thereon, a P type second base layer 4 superposed thereon, an N type cathode layer 5 of a disc shape eccentrically superposed therein and an auxuliary region 6 formed in the second base layer 4. The cathode electrode 7, the auxiliary electrode 9 and the anode electrode are respectively in contact with the cathode layer 5, the auxiliary region 6 and the second base layer 4, and the anode layer. The cathode layer 5 is eccentric to the second base layer 4, and the auxiliary region 6 is formed in the wider portion of the second base layer 4. Further, the auxiliary electrode 9 is eccentric to the semiconductor device and to the cathode layer. The auxiliary electrode is formed apart from and surrounding the cathode electrode. But the auxiliary electrode may not surround the cathode layer completely. The gate electrode 8 is formed on the gate peripheral zone 12 in the vicinity of the enlarged corridor 14. That is to say, the width of the peripheral zone 12, 13 and the width of the corridor 14, 15 are respectively formed with a lack of uniformity along the whole periphery thereof. As described in FIGS. 1 and 2, the width value $L_1$ of the gate peripheral zone 12 and the width value $l_1$ of the enlarged corridor 14 are respectively formed to be larger than the width value $L_2$ of the other peripheral zone 13 and the width value $l_2$ of the other corridor 15.

Figure 5:
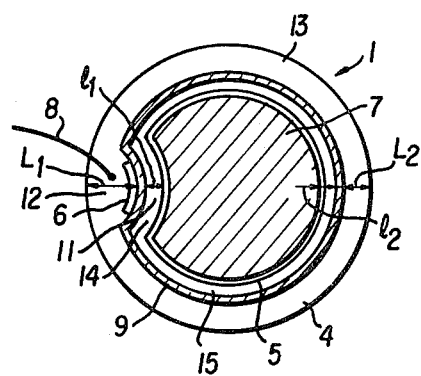
FIG. 5 is a plan view of a semiconductor device according to yet another embodiment of the present invention.

The semiconductor device comprising the cathode layer 5 having a cut off portion is shown in FIG. 5. The cathode layer 5 having the cut off portion which is an oxbow, is in contact with the cathode electrode 7 being similar thereto. The ring auxiliary electrode 9 shaped similar to the cathode layer 5 is formed apart from and surrounding the cathode electrode. The gate peripheral zone 12 in contact with the gate electrode 8 is formed larger than the other peripheral zone 13 of which the width is uniform and the enlarged corridor 14 is formed larger than the other corridor 15 of which the width is uniform.

In the above embodiments, a reverse blocking thyristor is described as the semiconductor device. Further, this invention is applicable to a reverse conductive thyristor, a triac or the like. As described in the above, the current produced in the gate peripheral zone and in the other peripheral zone flows uniformly into the cathode layer through the auxiliary region, the auxiliary electrode and the corridors of the second base layer. Therefore, a semiconductor device which is satisfactory as regards current characteristics can be provided. Furthermore, as the current flows uniformly through the corridors of the second base layer into the cathode layer, the semiconductor device of this invention is able to withstand a larger current, a surge current or the like.

Obviously, numerous modifications and variations of the present invention are possible in light of the above teachings. It it therefore to be understood that therein the scope of the appended claims, the invention may be practiced otherwise than as specifically described herein.

What is new and desired to be secured by Letters Patent of the United States is:

1. A semiconductor device comprising:

a semiconductor body having first and second opposing principal surfaces including an anode layer of a first conductivity type having a surface exposed to said first principal surface, a first base layer of a second conductivity type superposed on said anode layer and forming a PN junction therewith, and a second base layer of said first conductivity type superposed on said first base layer and forming a PN junction therewith, said second base layer including a portion of its surface exposed to said second principal surface;

a cathode layer of said second conductivity type formed in said second base layer, a portion of the surface of said cathode layer being exposed to said second principal surface;

an auxiliary region of said second conductivity type formed in said second base layer, said auxiliary region being separated from said cathode layer, said auxiliary region having a portion of its surface exposed to said second principal surface;

a cathode electrode in contact with a portion of the surface of said cathode layer;

an anode electrode in contact with the surface of said anode layer;

an auxiliary electrode in contact with a portion of the surface of said auxiliary region and in contact with a portion of the surface of said second base layer, said auxiliary electrode substantially surrounding said cathode layer and said cathode electrode and being spaced apart therefrom; and a gate electrode in contact with the surface of said second base layer, said gate electrode located external to said auxiliary electrode, said auxiliary region laying between said gate electrode and said cathode electrode;

wherein said semiconductor device includes a peripheral zone, said peripheral zone being the area of said second principal surface lying between said auxiliary electrode and an outer edge of said second base layer, said peripheral zone including a gate peripheral portion in the vicinity of said auxiliary region and said gate electrode, said gate peripheral portion having a greater width than any of the remaining portions of said peripheral zone; and wherein said semiconductor device further includes a corridor zone, said corridor zone being the area of said second principal surface lying between said auxiliary electrode and said cathode electrode, said corridor zone including a gate corridor portion in the vicinity of said auxiliary region, said gate corridor portion having a greater width than any of the remaining portions of said corridor zone.

2. The semiconductor device according to claim 1, wherein:

the shape of said cathode electrode is similar to that of said cathode layer.

3. A semiconductor device comprising:

a semiconductor body having first and second opposing principal surfaces including an anode layer of a first conductivity type having a surface exposed to said first principal surface, a first base layer of a second conductivity type superposed on said anode layer and forming a PN junction therewith, and a second base layer of said first conductivity type superposed on said first second base layer including a portion of its surface exposed to said second principal surface;

a cathode layer of said second conductivity type formed in said second base layer, a portion of the surface of said cathode layer being exposed to said second principal surface, said cathode layer having an edge in the shape of comb teeth;

an auxiliary region of said second conductivity type formed in said second base layer, said auxiliary region being separated from said cathode layer, said auxiliary region having a portion of its surface exposed to said second principal surface;

a cathode electrode in contact with a portion of the surface of said cathode layer;

an anode electrode in contact with the surface of said anode layer;

an auxiliary electrode in contact with a portion of the surface of said auxiliary region and in contact with a portion of the surface of said second base layer, said auxiliary electrode having an annular shape, said auxiliary electrode surrounding said cathode layer and said cathode electrode and being spaced apart therefrom; and a gate electrode in contact with the surface of said second base layer, said gate electrode located external to said auxiliary electrode, said auxiliary region lying between said gate electrode and said cathode electrode;

wherein said semiconductor device includes a peripheral zone, said peripheral zone being the area of said second principal surface lying between said auxiliary electrode and an outer edge of said second base layer, said peripheral zone including a gate peripheral portion in the vicinity of said auxiliary region and said gate electrode, said gate peripheral portion having a greater width than any of the remaining portions of said peripheral zone; and wherein said semiconductor device further includes a corridor zone, said corridor zone being the area of said second principal surface lying between said auxiliary electrode and said cathode electrode, said corridor zone including a gate corridor portion in the vicnity of said auxiliary region, said gate corridor portion having a greater width than any of the remaining portions of said corridor zone.

4. The semiconductor device according to claim 1, wherein:
said semiconductor body is disc shaped.

5. The semiconductor device according to claim 4, wherein:
said disc shaped cathode layer has a cut off portion.

6. The semiconductor device according to claim 5, wherein:
said cathode layer is concentric with respect to said semiconductor body.

7. The semiconductor device according to claim 4, wherein:
said cathode layer is eccentric with respect to said semiconductor body.

8. The semiconductor device according to claim 6 or 7, wherein:
said cathode layer is in a truncated circular shape.

9. The semiconductor device according to claim 6, wherein:
said cathode layer includes an oxbow shaped cut-off portion.

10. The semiconductor device according to claim 8, wherein:
the shape of said cathode electrode is similar to that of said cathode layer.

11. The semiconductor device according to claim 10 or 2, wherein:
the shape of the edge of said auxiliary electrode is similar to that of the edge of said cathode electrode.

12. The semiconductor device according to claim 1 wherein:
the width of said gate peripheral zone and said gate corridor respectively substantially constant.

13. The semiconductor device according to claim 5, wherein:
said auxiliary electrode has an annular shape and completely surrounds said cathode layer and said cathode electrode; and
the edge of said cathode layer is in the shape of comb teeth.

14. The semiconductor device according to claim 5 wherein:
said auxiliary electrode has an annular shape and completely surrounds said cathode layer and said cathode electrode; and
the edge of said cathode electrode is in the shape of comb teeth.

15. The semiconductor device according to claim 4, wherein:
said auxiliary electrode is eccentric with respect to said semiconductor body.

16. The semiconductor device according to claim 4, wherein:
said cathode layer is eccentric with respect to said auxiliary electrode.

* * * * *